United States Patent [19]
Keating

[11] 4,121,154
[45] Oct. 17, 1978

[54] ALTERNATING CURRENT POTENTIAL MEASURING DEVICE

[75] Inventor: Charles M. Keating, Portland, Oreg.

[73] Assignee: The United States of America as represented by the Secretary of the Interior, Washington, D.C.

[21] Appl. No.: 749,584

[22] Filed: Dec. 10, 1976

Related U.S. Application Data

[63] Continuation of Ser. No. 622,345, Oct. 14, 1975, abandoned.

[51] Int. Cl.² .......................... G01R 1/20; G01R 15/04
[52] U.S. Cl. .......................................... 324/126; 324/72
[58] Field of Search .................. 324/126, 127, 132, 32, 324/72, 109

[56] References Cited

U.S. PATENT DOCUMENTS

| 3,281,689 | 10/1966 | Schneider et al. | 324/132 |
| 3,370,225 | 2/1968 | Winder | 324/32 |

*Primary Examiner*—Rudolph V. Rolinec
*Assistant Examiner*—Ernest F. Karlsen
*Attorney, Agent, or Firm*—Thomas Zack; Donald A. Gardiner

[57] ABSTRACT

A high voltage measuring device used to measure the amount of voltage in an alternating current carrying line. When in use no connections or physical contact are made between the line and the measuring device. Generally, the measuring device acts according to the capacitor divider principle with two capacitors. One electrode of one capacitor is the high voltage line itself and the other electrode of this same capacitor is a spaced flat circular plate located on the measuring device. The measuring device electrode is insulated near its periphery and connected to a low voltage capacitor having a low loss and good temperature coefficient. This capacitor forms the other part of the capacitor divider. The voltage signal across the low voltage capacitor is coupled to a high impedance operational amplifier which drives the signal through a shielded cable to a remote grounded location where a root mean square converter changes the alternating current signal to a direct current signal and sends it to a voltmeter readout unit.

5 Claims, 5 Drawing Figures

ALTERNATING CURRENT POTENTIAL MEASURING DEVICE

This is a continuation of application Ser. No. 622,345 filed Oct. 14, 1975, now abandoned.

BACKGROUND OF THE INVENTION

1. Field of the Invention

The invention disclosed in this specification is a voltage measuring device for use with a high voltage alternating current power line.

2. Description of the Prior Art

When it is desired to measure the voltage in a power line carrying several thousand volts two types of devices are currently in widespread general use. One is the potential transformer and the other is the capacitor coupled voltage transformer (CCVT). Generally, it can be said that the CCVT replaces the potential transformer because of its much lower cost. Both units require direct connections to the bus or high voltage line and both are large pieces of equipment requiring crews of men to install, replace, or transport them for test purposes.

My invention is quite different from both of these measuring devices. It not only is a fraction of the original cost, weighs a fraction of the weight of either of these devices, but also requires much less labor and time to set up, service, test, or maintain it.

Of the known prior patent art, the closest reference is that of H. W. Ecker et al bearing U.S. Pat. No. 2,927,269. Basically, this reference discloses the use of a capacitive-resistive with a low voltage low current indicator. One of the test electrodes is radioactive and in a probe with the spacing between this probe and the test surface or bus line forming a capacitor without actually contacting the line. My invention is similar, however, it differs in that it overcomes the required discharge needed in the Ecker invention (see column 1, lines 17-55), does not require a radioactive electrode in the probe to work, and contemplates operating in the capacitive mode. Other advantages or differences over Ecker are that my invention will readily measure a.c., but will not be satisfactory for d.c. measurements as in Ecker.

SUMMARY OF THE INVENTION

The potential measuring apparatus forming this invention utilizes the test or bus line as a first spaced electrode. Within the apparatus a second electrode surface is supported on an insulating surface and spaced a known distance from the first electrode and has a ground connected support. The line voltage signal is capacitively coupled to the second electrode which signal is fed to a low voltage capacitor forming the second capacitor of a capacitor divider. Appropriate circuitry detects the signal across the second capacitor and then converts it to a signal representative of the line voltage. This latter signal is then sent to a suitable readout unit.

The primary object of this invention is an improved potential measuring device for a high voltage alternating current power line.

Figure 1:
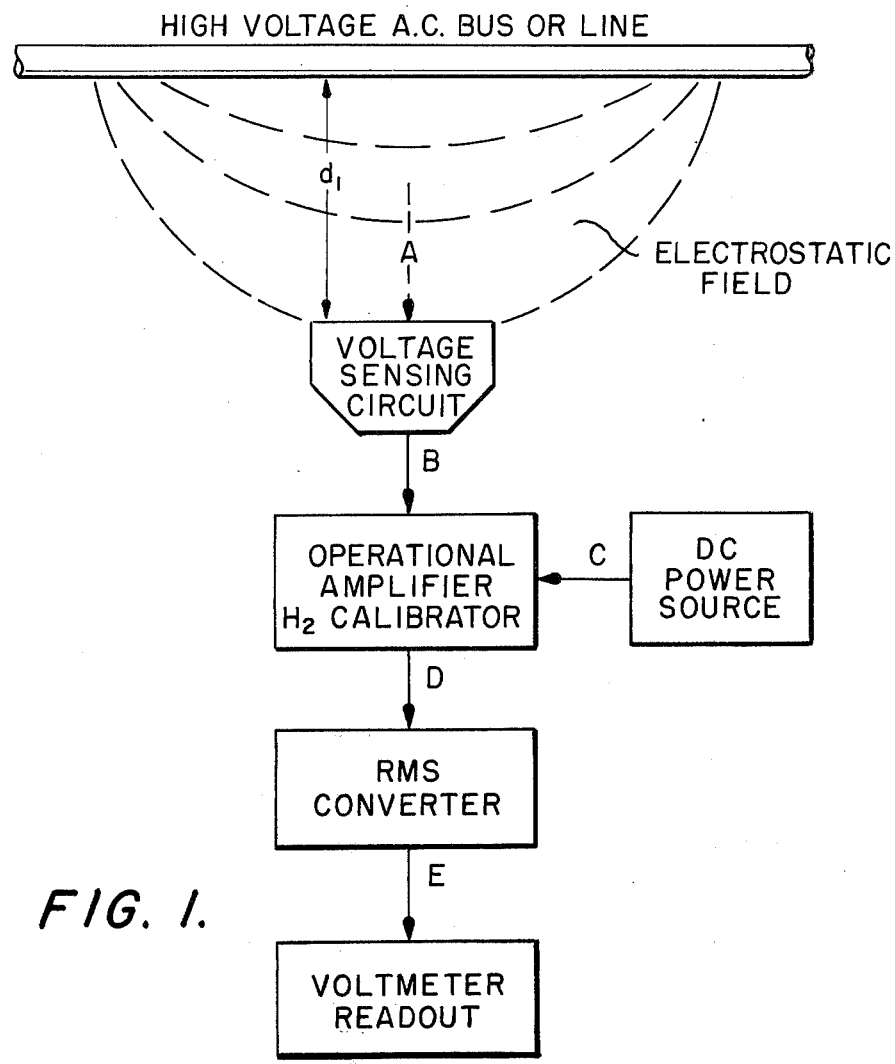
FIG. 1 is a block diagram of a voltage reading system using my invention.

FIG. 1 illustrates one possible system in block diagram format employing my invention. The alternating current (a.c.) in the high voltage line is that which is typically found in a high power transmission line. For illustration purposes this can be assumed to be at 60 hertz and 500 kilovolts (Kv). Voltage levels exceeding the 1,000 Kv level and much lower than 10 Kv have also worked successfully with a prototype model embodying this invention. Whatever, the particular voltage level to be detected, the essence of my invention resides in the block designated as a voltage sensing circuit. This block would include what is to be described in detail with respect to FIGS. 2-4. Its purpose is to accurately and reliably sense the voltage signal from the bus and output a signal B that is a true reproduction of the bus voltage signal. This signal B would have the same phase and time phase relationship as the actual bus voltage signal but would be reduced in magnitude by a factor of 150,000:1 so that it can be easily handled by the remaining circuitry. Associated with the sensing circuit is a small DC power source that supplies power thereto at plus and minus 15 volts DC. This supply powers the operational amplifier which is located therein as well as a second operational amplifier located remote from the sensing circuit.

Signal B is sent to this second operational amplifier $H_2$ separated from the sensing circuit. This second amplifier has a trim pot (see FIG. 5) for overall system calibration. Calibration takes place every time the fixed distance between the bus line and voltage sensing circuit changes to insure that the detected signals from the line are accurately read. At the output of this second amplifier an a.c. signal D is imputted to a root mean square (RMS) converter which converts this signal D to a direct current (D.C.) signal E. Signal E is in turn sent to an analog or digital voltmeter readout. Here an observer reads out the magnitude of the voltage on the bus line under observation.

Figure 2:
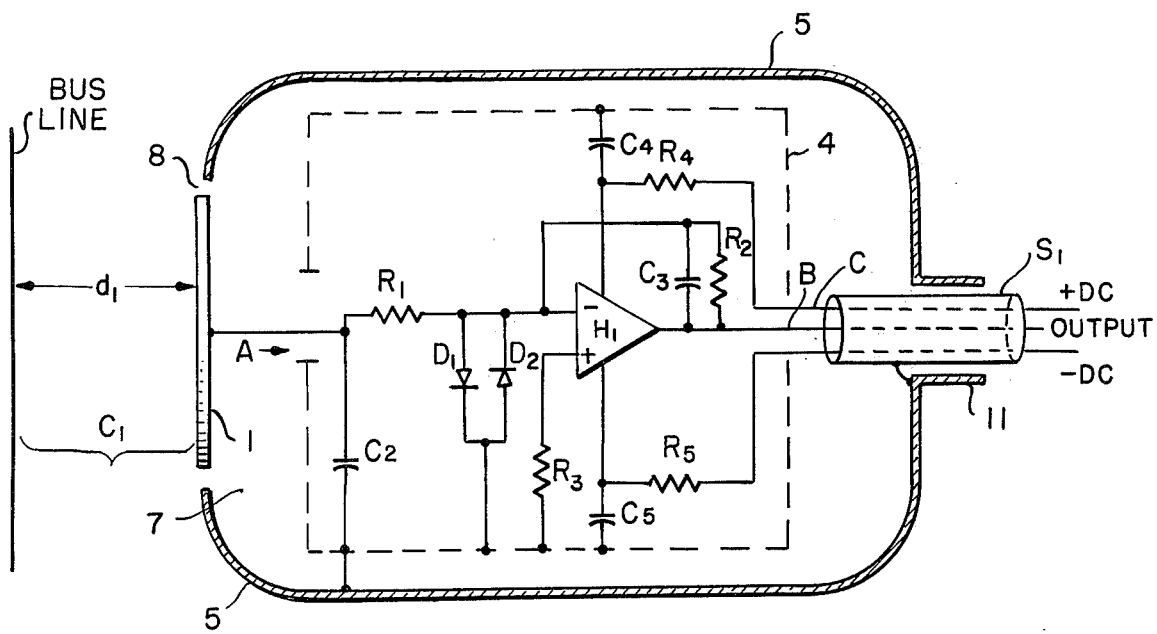
FIG. 2 is a circuit diagram of the voltage sensing circuit.

FIG. 2 shows the circuitry within the voltage sensing circuit. The fixed distanced between the bus line and electrode plate 1 has been greatly reduced for ease in illustration. In one working embodiment this distance was about 30 feet although theoretically any distance may be used. Factors such as the ground plane and other conducting surfaces in the area would have to be considered in selecting the distance. The electrostatic field surrounding the bus is capacitively coupled to the sensing circuit where the first electrode can be considered the bus and the second electrode the plate electrode 1 of a capacitor with a value of C1. Surrounding the plate on two sides and all of the circuitry within the voltage sensing block is a ground plane 5, which acts to shield the circuitry from extraneous interferring waves. The voltage signal A sensed by the plate 1 is divided between the two capacitors C1 and C2 which form the capacitor divider of this invention. The values of voltage appearing across each of these two capacitors are quite different with the capacitor C1 having a voltage approximately the same as the actual bus line to gound voltage and the capacitor C2 a voltage equal to the line volts times (C1/C2).

Signal A is sent to the resistor R1 which in conjunction with the resistor capacitor combination R2 and C3 across operational amplifier H1 acts to set the output reproduction value (signal B) of signal A through amplifier H1. This value is usually much less than unity and is typically about a factor of 0.10 meaning signal B is reduced by a factor of 10 or is one-tenth the value of signal A. Operational amplifier H1 has a high impedance and is operated in the inverting mode in this example. Its output signal B is a low impedance and can drive several hundred feet of cable. Usually this cable will end in a suitable control terminal in which the operational amplifier, RMS converter, and voltmeter readout unit shows as block in FIG. 1 are located. Diodes D1 and D2 connected as shown in FIG. 2 between the negative input and ground serve as protection to the circuit from high voltage transients in the bus line. Resistor R3 supplies a zero signal to the noninverting input of amplifier H1 to provide the proper bias thereto. Resistors R4 and R5 act in concert with their, respective, associated capacitors C4 and C5 as filters for plus and minus 15V DC from the power supply. Negative feedback resistor R2 in conjunction with resistor R1 is used to establish the gain of amplifier H1. When the value of resistor R1 is equal to the value of R2, the gain is one. When the value of R2 is greater than the value of R1 the gain is more than one. Mathematically this can be expressed as (1) Gain = (R2/R1). Whatever the value of signal A, the gain of amplifier H1 should be such that its output signal B is between one and five peak volts. The exact value, however, is not critical because the next stage of amplification will be calibrated to take these values into consideration.

In one working embodiment of this sensing circuit the operational amplifier H1 was type LH 740 manufactured by National Semiconductor Co., Santa Clara, Calif.; the two diodes D1 and D2 were type IN 914 from Texas Instruments, Inc., of Dallas, Tex.; the resistors R1 and R2 were $5 \times 10^6$ and $2.5 \times 10^6$ ohms, respectively, of the temperature compensating metal film type with a temperature coefficient of 50 parts per million per degree C.°; the capacitor C2 was 100,000 picofarads; and the resistor R3 was a 10Kohm resistor.

Figure 3:
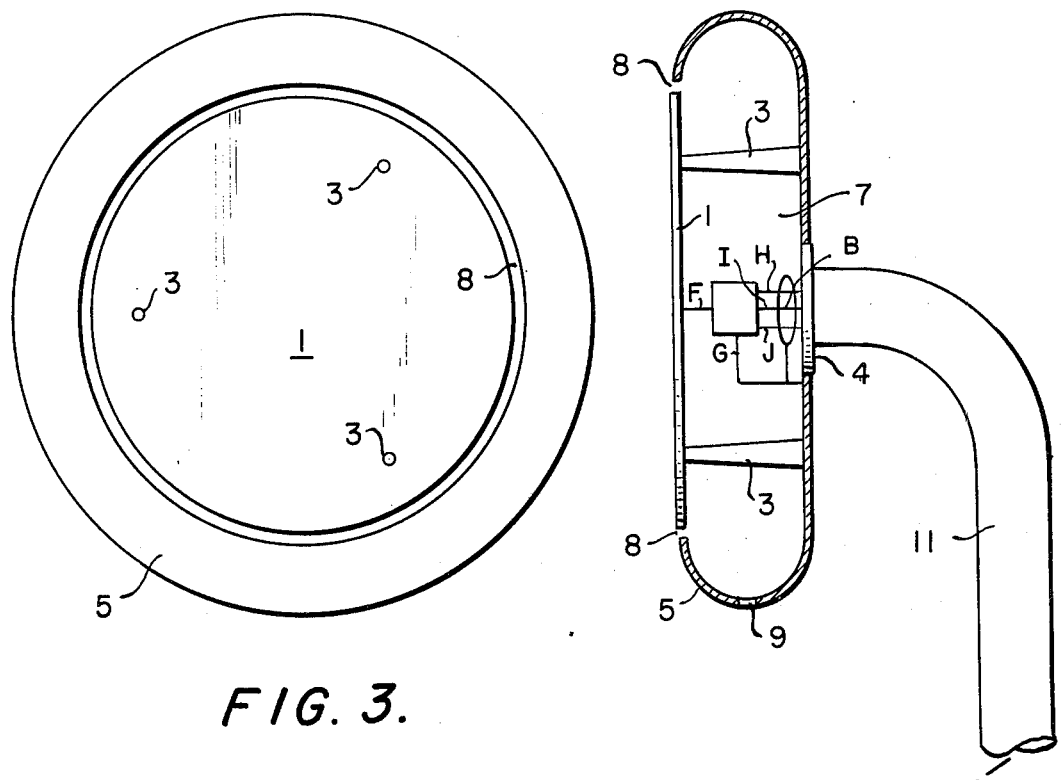
FIG. 3 is a front view of the electrode assembly of the voltage sensing circuit.
Figure 4:
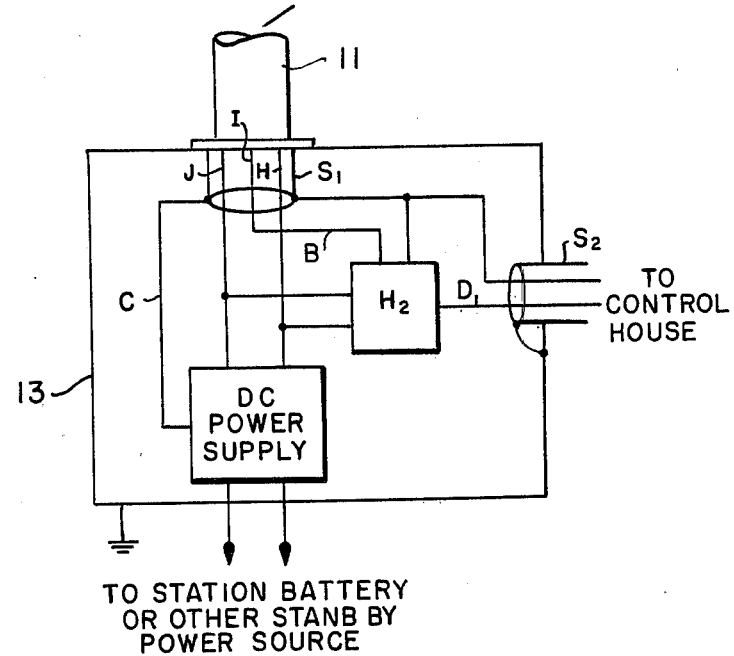
FIG. 4 is a cross sectional side view of the FIG. 3 voltage sensing unit depicting in addition its support assembly and connected circuitry.

FIGS. 3 and 4 represent the front and side views, respectively, of the preferred embodiment of the plate electrode assembly. The circular flat plate electrode 1, as in FIG. 2, is supported by a tripod arrangement of three separate identical porcelain insulators 3 near its periphery. Surrounding this plate of about 26 inches in diameter is a small circular air gap 8 about one sixteenth of an inch which serves to separate the electrode from a thirty inch diameter concentric circular ground shield 5 with a water drain hole 9. The pipe support 11 of about 1.5 inches in diameter (see FIG. 4) holds the electrode in cantilever fashion pointing so that the flat surface of the plate parallels the bus line. The sensing circuit 4 of FIG. 2, represented by that which is enclosed by the dotted lines within the block, is connected by line F to the plate, to the ground shield by line G, to the DC power supply by lines H and J, and to the output (signal B) by connection I. Several feet away at the lower end of the pipe support a ground metal braid sheath S, which connects to the shield 5 through the pipe is shown. Around this lower end a grounded box 13 encloses the common d.c. power supply of ±15 volts for the voltage sensing circuit and for the operational amplifier H2. FIG. 4 shows more details of this circuit. Like the power supply, the amplifier H2 is connected to the distant sensing circuit and receives its output signal B. In turn this amplifier outputs signal D to a control house or other instrumentation (not shown) like a root mean square (RMS) voltage converter as depicted in block format in FIG. 1. One type of RMS converter connected to the output of a working embodiment was type R101 by Intronics Co. of Newton, Mass. Another ground shielded cable S2 may also be used to at the output connection of this amplifier.

Figure 5:
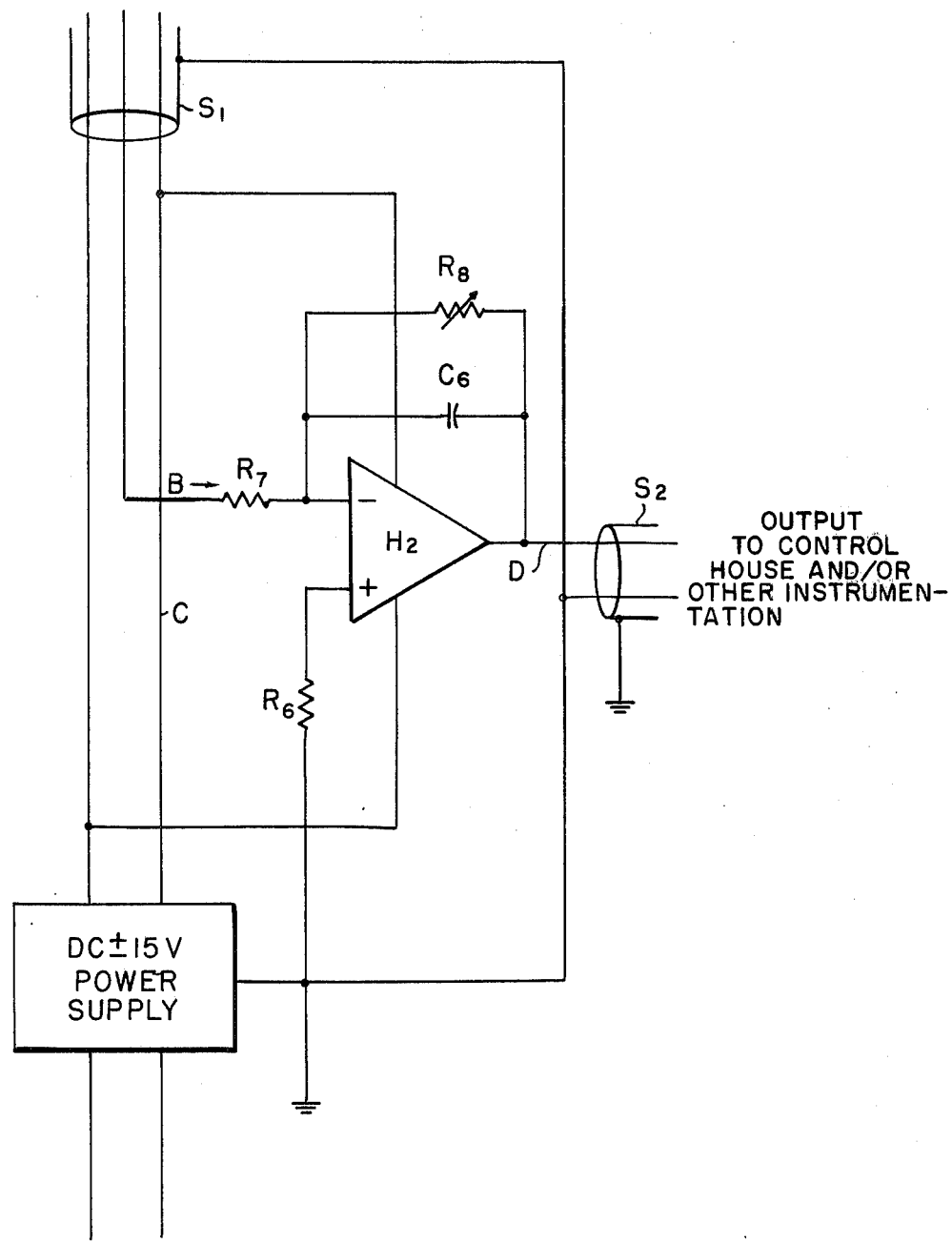
FIG. 5 illustrates more details of the FIG. 4 circuitry used to receive the sensed signal B.

More details of the circuitry shown enclosed by block 13 of FIG. 4 are illustrated in FIG. 5. Operational amplifier H2 receives signal B from the sensing circuit after passing through resistor R7. A negative feedback loop made up of variable resistor R8 and parallel capacitor C6 acts as a trimming potentiometer to calibrate the operation of the sensing circuit for different distances d1. Adjustments of resistor R8 change the multiplying factor or gain for operational amplifier H2. Signal D from this amplifier is sent to the RMS converter which outputs a signal E to the voltmeter readout unit.

Other devices besides a RMS converter could also be driven by the amplitude of signal D such as a digital a.c. voltmeter, or an analog a.c. voltmeter. Similarly these digital and analog voltmeters could be connected as is the readout unit to the RMS converter. Examples of instruments actually used for the voltmeter model 3480 with 043 option by the Hewlett Packard company; for the analog a.c. voltmeter type 400 also from Hewlett Packhard company; and for the RMS converter either type R101 by Intronics company or type 440 from Analog Devices of Norwood, Mass.

The 100,000 pirofarad capacitor C2 acts to satisfy the expression: (2) $(V1/V2) = (C2/C1)$, where C1 and C2 are the capacitive values previously indicated and V1 and V2 the respective voltages across them. Capacitor C2 should be made from two equal parallel sections. One section could be made of metal film on polystyrene and the other section a metal film on polycarbonate such that each section holds about fifty percent of the total capacitance. Their combined temperature coefficient would approach that of air. Thus, according to equation (2) a capacitor divider would be formed which inversely divides the capacitor ratio. The electrode area of the plate surface 1 facing parallel to the bus line will vary directly with respect thereto such that the larger an area is involved the larger will be the value of C1. The value of C2 would as a consequence also vary according to equation (2).

Materials that could be used for the flat plate electrode 1 include all good conductors such as aluminum, copper, iron, stainless steel, etc. The materials used to insulate the support 3 may be any good insulator like porcelain that has very low voltage leakage. Other types of configurations could conceivably be used for the plate electrode, such as a sphere, however, tests conducted indicate the flat plate type to be preferred as to performance and accuracy.

As described this invention can be used to read the magnitude of alternating current voltage in a single high voltage power line without actually connecting it to the line. As a practical consequence in the high voltage power transmission lines currently in widespread use a plurality of parallel lines, are connected in bundle type groups many feet above the ground. If one of the sensors is used to read the voltage level in each line, a problem arises in the interacting electrical field interference caused by the adjacent a.c. lines. Conceivably after each sensors obtains a reading, a mathematical correction can be made to these readings to determine their respective true values at a given time.

It should be apparent that variations to the components used with this invention other than those disclosed could be employed. The extent and scope of the invention is, therefore, not to be measured by the disclosed preferred embodiment but only by the claims which follow.

I claim:

1. A voltage measuring apparatus for measuring the magnitude of the voltage on an alternating current power line without physically contacting said line with the apparatus comprising in combination:

an elongated power line attached to and supported above the earth for carrying a high voltage alternating current, said line forming a first electrode;

a voltage sensing apparatus having a second electrode with a generally flat planar surface which is adapted to face towards and substantially parallel with the elongated length of said power line, said second electrode also being spaced a known distance from said first electrode with ambient gas therebetween;

said first and second electrodes acting as a first capacitor with said ambient gas therebetween;

a second capacitor electrically connected to said second electrode at one side and to ground potential at the other side so that a voltage signal can be impressed thereon from said second electrode;

an electrically grounded shield surrounding said second electrode on all sides excepting its planar surface facing towards and parallel to said power line, said second electrode being supported by an insulated support means relative to said electrically grounded shield, said grounded shield surrounding and being connected to said second capacitor at its ground potential side and said grounded shield being supported by means of a pole above the earth;

circuit means encompassed by said grounded shield for detecting the magnitude of said voltage signal and converting it to a second electrical signal representative of the voltage drop between the first and second electrodes; and remote readout means outside of said grounded shield electrically connected to said circuit means for displaying the magnitude of said second signal.

2. The apparatus of claim 1 wherein said first and second capacitors form a capacitor divider with the voltage drop across said first capacitor being greater by a factor of at least one hundred than that of said second capacitor.

3. The apparatus of claim 1 wherein said second electrode has a circular periphery with the adjacent section of said grounded shield also being circular and concentric therewith, said same electrode having a flat back surface extending in the same direction as said power line with an air space therebehind.

4. The apparatus of claim 1 wherein said circuit means comprises an operational amplifier resistively coupled directly to said second capacitor.

5. The apparatus of claim 4 wherein said circuit means has its own power source to set the operational parameters thereof.

* * * * *